(12) United States Patent
Kiyota

(10) Patent No.: US 8,269,103 B2
(45) Date of Patent: Sep. 18, 2012

(54) ELECTRICAL JUNCTION BOX

(75) Inventor: Hirotaka Kiyota, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 200 days.

(21) Appl. No.: 12/659,962

(22) Filed: Mar. 26, 2010

(65) Prior Publication Data

US 2010/0258328 A1 Oct. 14, 2010

(30) Foreign Application Priority Data

Mar. 27, 2009 (JP) .................................. 2009-078197

(51) Int. Cl.
*H05K 5/00* (2006.01)
(52) U.S. Cl. ............................ 174/50; 439/535; 248/906
(58) Field of Classification Search .................... 174/50; 439/535; 248/906; 220/4.02
See application file for complete search history.

(56) References Cited

FOREIGN PATENT DOCUMENTS

| JP | 2005-051880 A | 2/2005 |
|----|---------------|--------|
| JP | 2005051880 A * | 2/2005 |
| JP | 2005-119331 | 5/2005 |

OTHER PUBLICATIONS

Office Action dated Feb. 16, 2012, issued for the corresponding Chinese patent application No. 201010149865.6 and English translation thereof.

* cited by examiner

*Primary Examiner* — Dhirubhai R Patel
(74) *Attorney, Agent, or Firm* — Edwards Wildman Palmer LLP

(57) ABSTRACT

An electrical junction box is fixed via at least one mounting foot to a component-fixation section in a crushable zone of a vehicle. The mounting foot includes a breakage-inducing portion. The breakage-inducing portion is provided between an insertion hole into which a fastening bolt is inserted for fixation of the electrical junction box, and an outer edge of the mounting foot. The breakage-inducing portion is provided such that a body of the box is displaced in a displacement direction in a vehicle collision, and the breakage-inducing portion resides on a displacement trajectory that the fastening bolt may describe. The breakage-inducing portion provided on the displacement trajectory of the fastening bolt includes a throughhole and a notch.

3 Claims, 5 Drawing Sheets

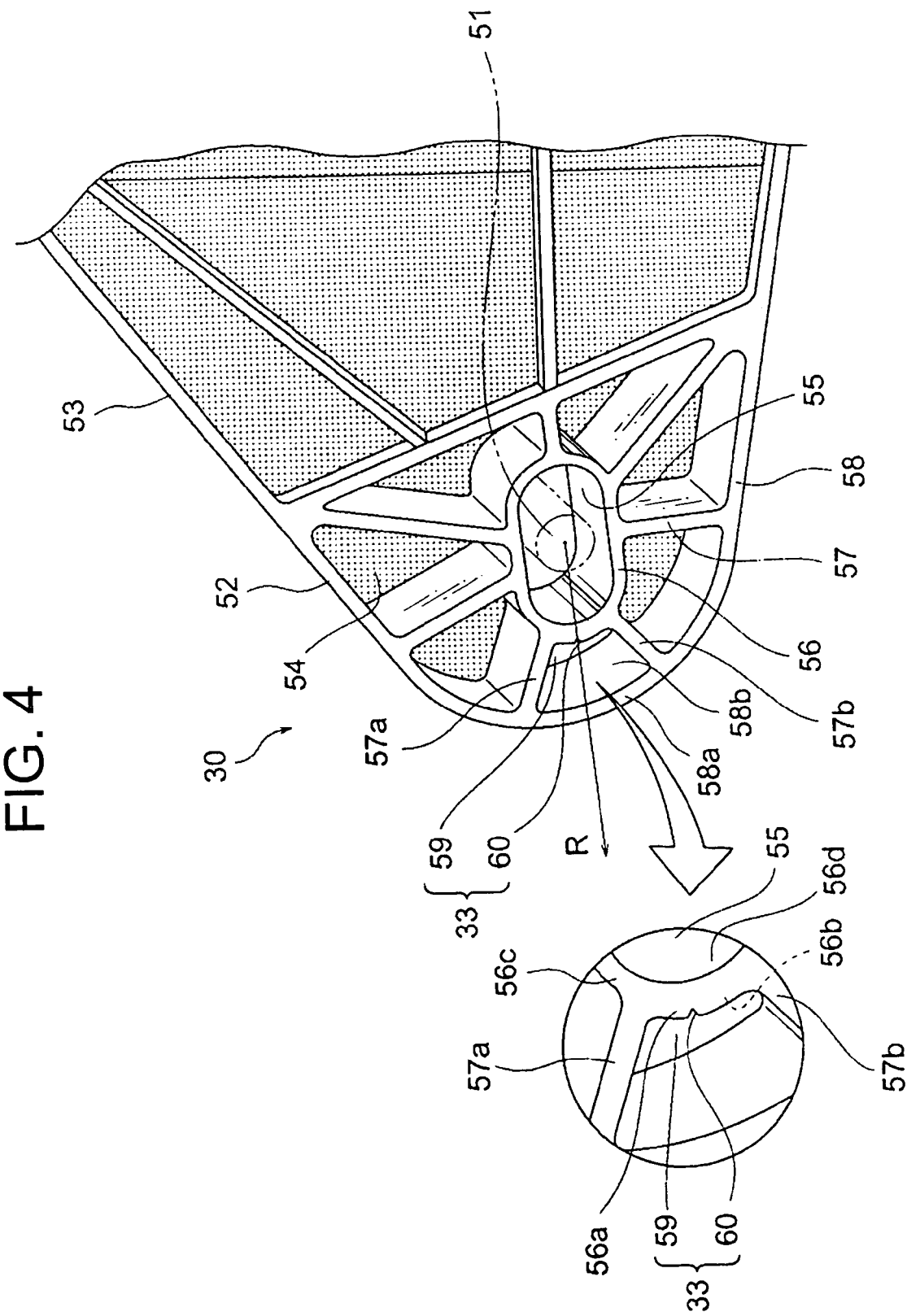

ELECTRICAL JUNCTION BOX

CROSS REFERENCE TO RELATED APPLICATION

The priority application Japanese Patent Application No. 2009-078197 upon which the present patent application is based is hereby incorporated by reference.

BACKGROUND OF THE INVENTION

1. Field of the Invention

The present invention relates to an electrical junction box disposed in and fixed to a crushable zone of a vehicle.

2. Description of the Related Art

In FIG. 5, the shown electrical junction box 1, as described in Japanese Patent Application Laid-Open Publication No. 2005-119331, includes one mounting foot 3 that has a breakage-inducing portion 2 and two mounting feet 4 that do not have a breakage-inducing portion 2. Thus, the electrical junction box 1 is fixed to and inside of an engine compartment 5 via three mounting feet 3 and 4 in two types with/without the breakage-inducing portion.

The illustrated electrical junction box 1 is a relatively large component that has an elongated shape, which is fixed inside of the engine compartment 5 with its longitudinal direction usually in parallel with a front-back direction of the engine compartment 5 (which accordingly corresponds to a front-back direction of a vehicle). Two mounting feet 4 that do not have the breakage-inducing portion 2 are forwardly positioned, while one mounting foot 3 that has the breakage-inducing portion 2 is rearward positioned. Each of the mounting feet 3, 4 is fastened and fixed via a fastening bolt (not shown) provided in the engine compartment 5 and a nut (not shown) adapted to be screwed into the fastening bolt.

When an impact force when in a vehicle collision acts intensively upon the breakage-inducing portion 2 of the rearward-positioned mounting foot 3, the breakage-inducing portion 2 induces breakage (or fracture) of the mounting foot 3. The breakage-inducing portion 2 is a portion that generates breakage and separation of the mounting foot 3. Specifically, the mounting foot 3 has a shape of a relatively larger hole. The breakage-inducing portion 2 is provided at a basal portion of the mounting foot 3 (i.e., closer to the box body 6 than a portion through which the fastening bolt is passed) such that it resides at a region deviated with reference to a fixation central axis L1 of the mounting foot 3.

In addition, as shown in FIGS. 5A, 5B, central axes L2, L3 of the two mounting feet 4 are not in agreement with the fixation central axis L1 of the mounting foot 3. The fixation central axes L1 and L2 are parallel to a direction in which the impact force when in the vehicle collision is exerted.

The mounting foot 3 needs to include a breakage-inducing portion 2 in a shape of a hole, the mounting foot has to possess sufficient mechanical strength (i.e., such a strength that allow the mounting foot 3 to endure fastening by the fastening bolt and nut). In view of this, some of the ribs of the mounting foot 3 (i.e., a ring-shaped rib through which the fastening bolt is passed) is relatively thick-walled for reinforcement of the mechanical strength of the mounting foot 3.

In the above-described configuration and structure, when the engine compartment 5 collapses in the event of the vehicle collision (here, collapse occurs from a front side to a rear side of the engine compartment 5), a front wall 7 of the box body 6 of the electrical junction box 1 is pressed by a front mask 8, so that a force acts upon the box body 6 that causes the box body 6 to be displaced rearward. At this point, an impact force at the time of the vehicle collision acts upon the rearward-positioned mounting foot 3. The breakage-inducing portion 2, due to topological relation among the fixation central axes L1, L2, L3, a crack is generated with a portion of an edge of the hole at which main stress resides being the origin of the breakage. When the crack becomes larger, the mounting foot 3 is brought into breakage at its basal portion.

After the mounting foot 3 has been broken at the basal portion thereof, the electrical junction box 1 in its longitudinally-fixed state is displaced and laterally positioned, so that the electrical junction box 1 is found in an empty space provided at a rear side of the engine 9 in the engine compartment 5.

The electrical junction box 1 disclosed in the above patent literature is aimed at escaping the box body 6 in a prescribed direction when in the vehicle collision so that a property of crushability of the vehicle is not degraded. It is also contemplated in the conventional electrical junction box 1 that the box body 6 itself is protected against damage.

SUMMARY OF THE INVENTION

In the above-described prior art, the breakage-inducing portion 2 is a simple hole and is provided at the basal portion of the mounting foot 3. Further, the breakage-inducing portion 2 is provided at a position deviated with reference to the fixation central axis L1. Accordingly, when the breakage-inducing portion 2 of this arrangement is applied to a mounting foot of another type of the electrical junction box, breakage will not always be induced effectively at the time of a vehicle collision, which fails to ensure that the box body is escaped in an intended direction (in other words, failing to control a detachment direction of the box body).

The present invention has been made in view of the above-described situations, and an object of the present invention therefore is to provide an electrical junction box that has a breakage-inducing portion that facilitates breakage of a mounting foot when in a vehicle collision, and has capability of controlling the detachment direction of the box body.

In order to solve the above-identified problem, the electrical junction box according to a first aspect of the present invention is an electrical junction box fixed to a component-fixation section in a crushable zone of a vehicle, comprising at least one mounting foot, the mounting foot including an insertion hole into which a fastening bolt upstanding on the component-fixation section is inserted a ring-shaped rib whose inner surface defines the insertion hole a plurality of radial rib radially extending from an outer surface of the ring-shaped rib; and a breakage-inducing portion configured to induce a breakage of the mounting foot in a vehicle collision. The breakage-inducing portion extends in a displacement direction in which a box body of the electrical junction box is displaced in the vehicle collision, and also resides on a displacement trajectory in which the fastening bolt is displaced in the vehicle collision.

Preferably, the breakage-inducing portion includes a throughhole defined by an outer surface of the ring-shaped rib, an outer edge of the mounting foot, and a pair of the radial ribs between which the displacement trajectory extends, and a notch provided on the outer surface of the ring-shaped rib, a recessed space of the notch continuing to the throughhole.

In the present invention having the above-described features, when the vehicle collision occurs, the mounting foot that includes the breakage-inducing portion is displaced relative to the fastening bolt corresponding to the mounting foot. In this process, the when a force acts from the fastening bolt to the breakage-inducing portion, breakage is induced. The mounting foot is brought into breakage with the fastening bolt passing at once from the insertion hole to the outer edge of the mounting foot.

According to the present invention, since the breakage-inducing portion is provided such that the box body is displaced in the displacement direction at the time of the vehicle collision, and that the breakage-inducing portion resides on the displacement trajectory that the fastening bolt may describe, it is possible to make a force at the time of the vehicle collision act effectively on the breakage-inducing portion. Accordingly, an advantageous effect is achieved that the mounting foot can be readily brought into breakage. Also, according to the present invention, another advantageous effect is that determination of arrangement of the breakage-inducing portion allows breakage to be reliably induced, so that the detachment direction of the box body can be more readily controlled.

Preferably, in the present invention, the breakage-inducing portion includes the throughhole and the notch, and crack can be readily generated that leads to breakage achieved by concentrating stress upon the notch (even when the ring-shaped rib is thick-walled to some extent, crack leading to the breakage can be readily generated). Accordingly, an effect is achieved that provides configuration and structure of the breakage-inducing portion that facilitates breakage of the mounting foot.

BRIEF DESCRIPTION OF THE DRAWINGS

FIG. 4 is an enlarged view of mounting foot (third mounting foot) of FIG. 2.

DESCRIPTION OF THE PREFERRED EMBODIMENT

An electrical junction box of the present invention is configured to be fixed via its mounting foot to a component-fixation section in a crushable zone of a vehicle, the mounting foot including a breakage-inducing portion. The breakage-inducing portion is provided between an insertion hole through which a fastening bolt for fixing the electrical junction box is passed, and an outer edge of the mounting foot. Also, the breakage-inducing portion is provided in a direction in which the box body is displaced when in a vehicle collision, and is provided such that the portion resides on a displacement trajectory that the fastening bolt describes (a trajectory in which the fastening bolt is displaced relative to the box body in the vehicle collision). The breakage-inducing portion residing on the displacement trajectory of the fastening bolt includes a throughhole and a notch.

Figure 1:
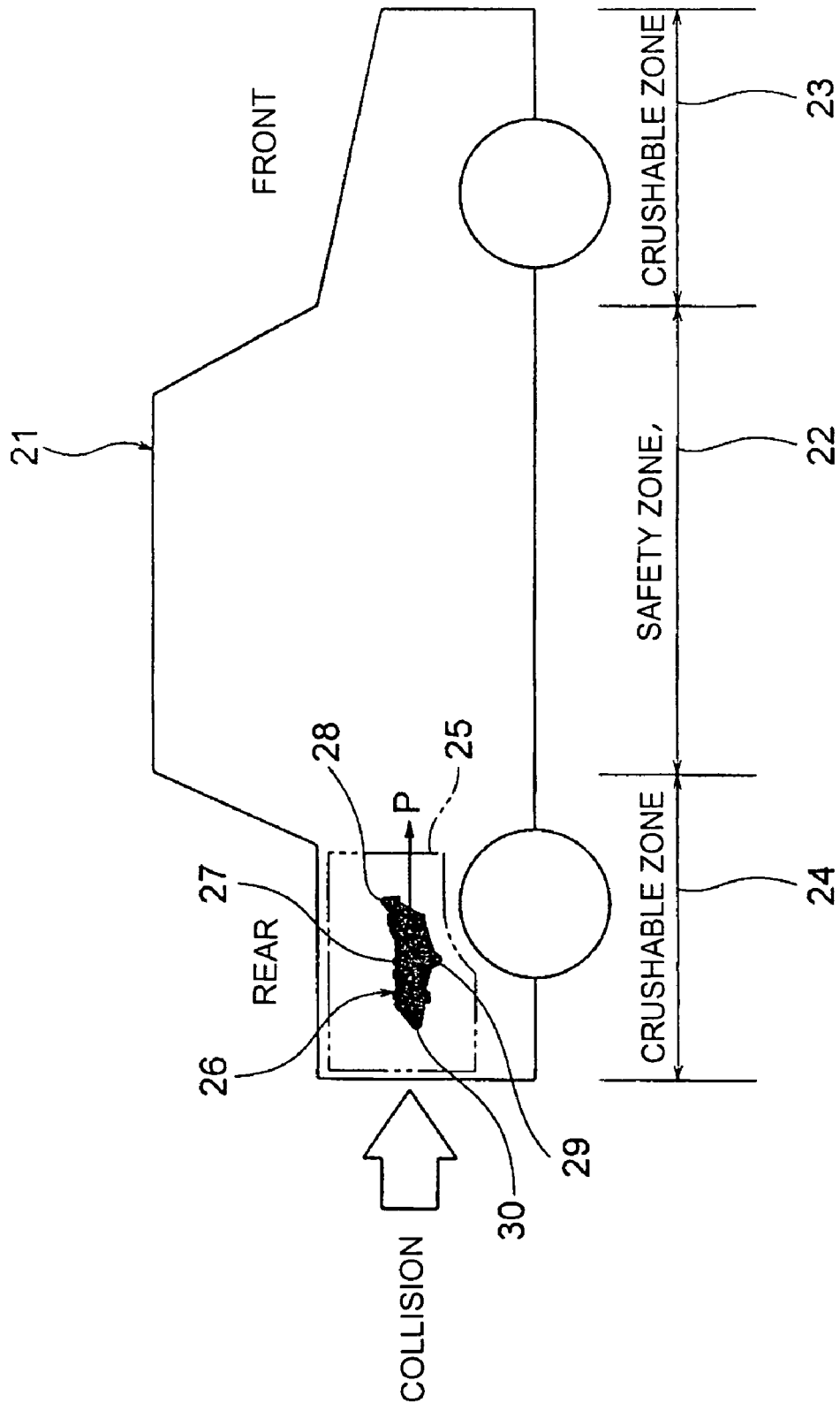
FIG. 1 is a view schematically illustrating an electrical junction box of the present invention in a state where the electrical junction box in mounted in a vehicle.
Figure 2:
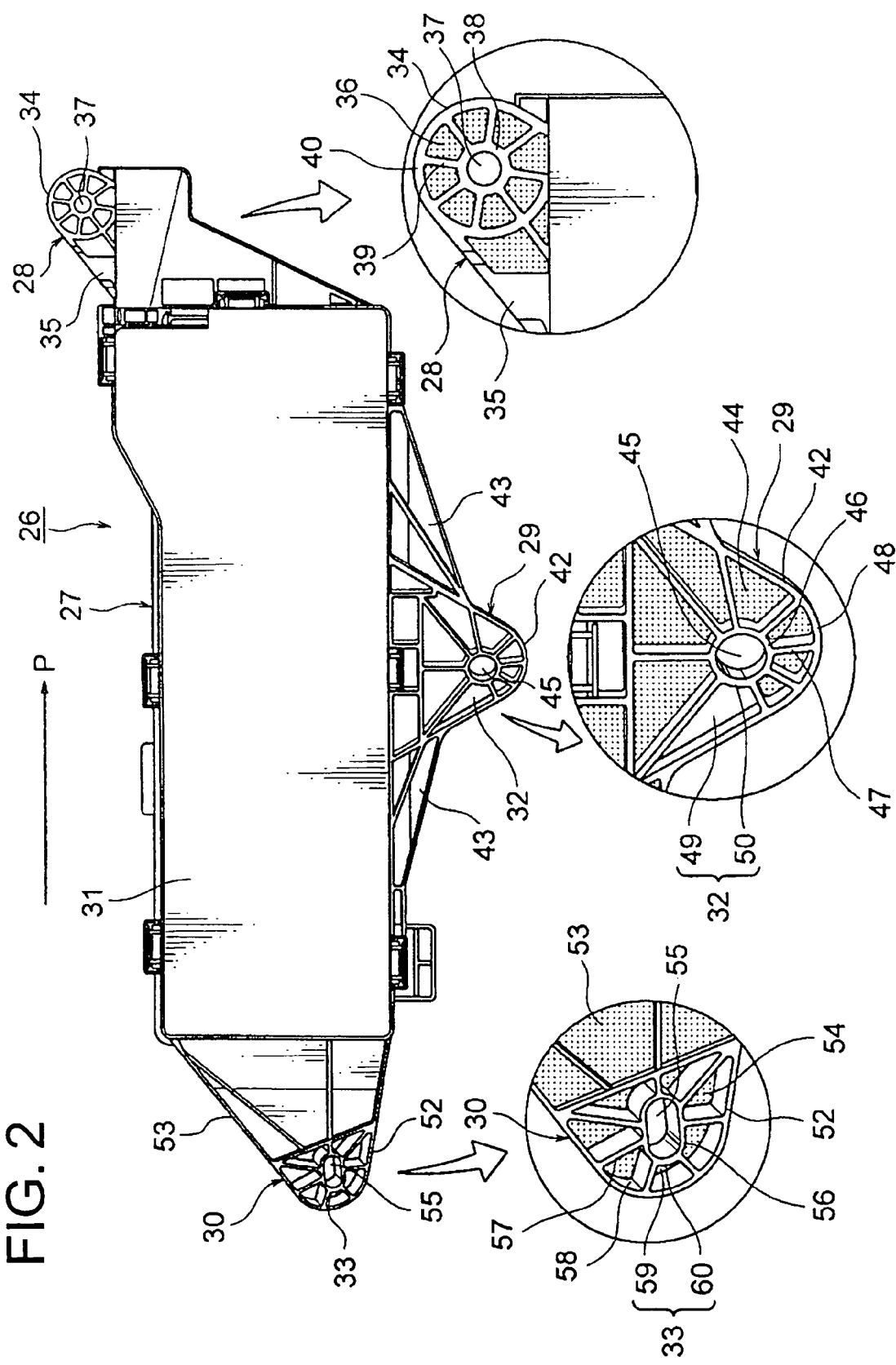
FIG. 2 is a view illustrating the electrical junction box when viewed from the side of a portion where a component is secured.
Figure 3:
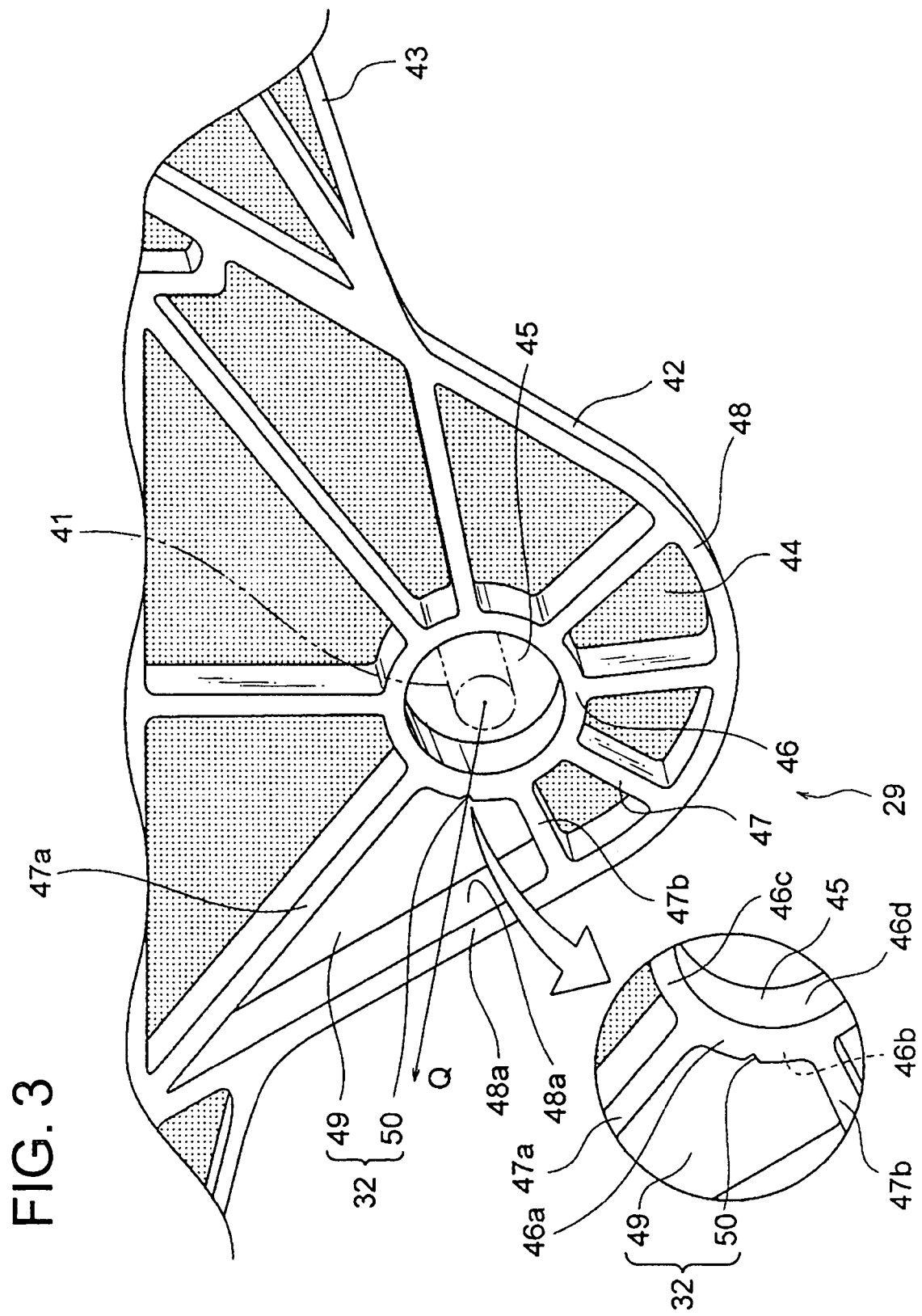
FIG. 3 is an enlarged view of mounting foot (second mounting foot) of FIG. 2.

In the following, an exemplary embodiment is explained with reference to the drawings. FIG. 1 is a schematic view of the electrical junction box of the present invention mounted in the vehicle. FIG. 2 is a view illustrating the electrical junction box when viewed from the side of a component-fixation section. FIG. 3 and FIG. 4 provides enlarged illustration of the mounting foot.

In FIG. 1, a body of the vehicle such as an automobile 21 has a safety zone 22 to provide a space for passenger's survival in a case of the vehicle collision and crushable zones 23 and 24 adapted to collapse and absorb the energy at the time of the vehicle collision.

An ECU (not shown) such as the electrical junction box 1 (see FIG. 1) described in the discussion of the prior art is fixed to a component-fixation section of the crushable zone 23 on a front side of the automobile 21. Also, the electrical junction box 26 of the present invention is fixed to a component-fixation section 25 (for example, a panel member and a bracket) of the crushable zone 24 on a rear side of the automobile 21. In the embodiment, the component-fixation section 25 is provided along a lateral side of the vehicle.

The electrical junction box 26 of the present invention, as will become apparent from the following explanation, has a configuration that allows control and/or regulation of a detachment direction of the box body 27 when in a vehicle collision. First, specific configuration and structure of the electrical junction box 26 is explained.

In FIG. 2, the figure shows the electrical junction box 26 viewed from the side of the above-described component-fixation section 25. The electrical junction box 26 includes a box body 27, a plurality of mounting feet 28, 29, 30 continuing to the box body 27. The box body 27 includes a lower case 31 made of synthetic resin, an upper case (not shown) made of synthetic resin and configured to be brought into engagement with the lower case 31, and an electrical functioning unit adapted to be accommodated in an internal space defined by the lower case 31 and the upper case (although the electrical functioning unit is not shown, it may be, and not limited to, a circuit board or an electronic component). The box body 27 may have substantially the same configuration and structure as those of a known one (description of which is omitted).

The mounting feet 28, 29, 30 is made as a one single piece with the lower case 31 and provided at a predetermined region of an outer edge of the lower case 31. Each of the mounting feet 28, 29, 30 serves as a portion for fixing the electrical junction box 26 to the component-fixation section 25 of the crushable zone 24 (see FIG. 1). The above-mentioned number and arrangement of the mounting feet is for the purpose of illustration and not of limitation. The mounting feet 28, 29, 30 in this embodiment each have a surface corresponding to a fixing surface of the component-fixation section 26. The mounting feet 28, 29, 30 in this embodiment are provided as, but not limited to, portions having such shapes that all of the three feet are not fixed on the same plane (this is for the purpose of illustration and not of limitation. They may be fixed on the same plane).

It is assumed in the following description that the mounting foot 28 is defined as a first mounting foot, the mounting foot 29 as a second mounting foot, and the mounting foot 30 as a third mounting foot. The breakage-inducing portion 32 (to be later-described) is provided at a predetermined region of the second mounting foot 29 and the breakage-inducing portion 33 at a predetermined region of the third mounting foot 30, which is a feature of the present invention (the number of the mounting feet having the breakage-inducing portion is for the purpose of illustration and not of limitation).

The first mounting foot 28 is a mounting foot configured to be arranged at a rightmost region in FIG. 2, in other words, at a position that is the most proximate to the safety zone 22 (see FIG. 1). Also, the first mounting foot 28 is configured to be fastened and fixed by a fastening bolt (not shown) upstandingly provided on the component-fixation section 25 (see FIG. 1) and a nut (not shown). The first mounting foot 28 includes a main fixing portion 34, and a connecting portion 35 that connects the main fixing portion 34 to the outer edge of the lower case 31.

The main fixing portion 34 includes (a) a flat wall 36 having a seat surface corresponding to the above-described not-shown nut (colored or shaded with dots for convenience of illustration), (b) a circular insertion hole 37 that passes through the wall 36 such that the above-described not-shown fastening bolt is inserted into the hole 37, (c) a ring-shaped rib 38 whose inner surface defines the insertion hole 37, (d) a plurality of radial ribs 39 radially extending from an outer surface of the ring-shaped rib 38, and (e) an outer ring-shaped rib 40 to which outer ends of the plurality of radial ribs 39 continue.

The insertion hole 37 is a throughhole whose diameter is slightly larger than a diameter of the not-shown fastening bolt. The radial ribs 39 extend at a same angle with reference to the center of the insertion hole 37. The radial ribs 39 connect the ring-shaped rib 38 to the outer ring-shaped rib 40. The outer ring-shaped rib 40 constitutes part of the outer edge of the first mounting foot 28.

Figure 5A:
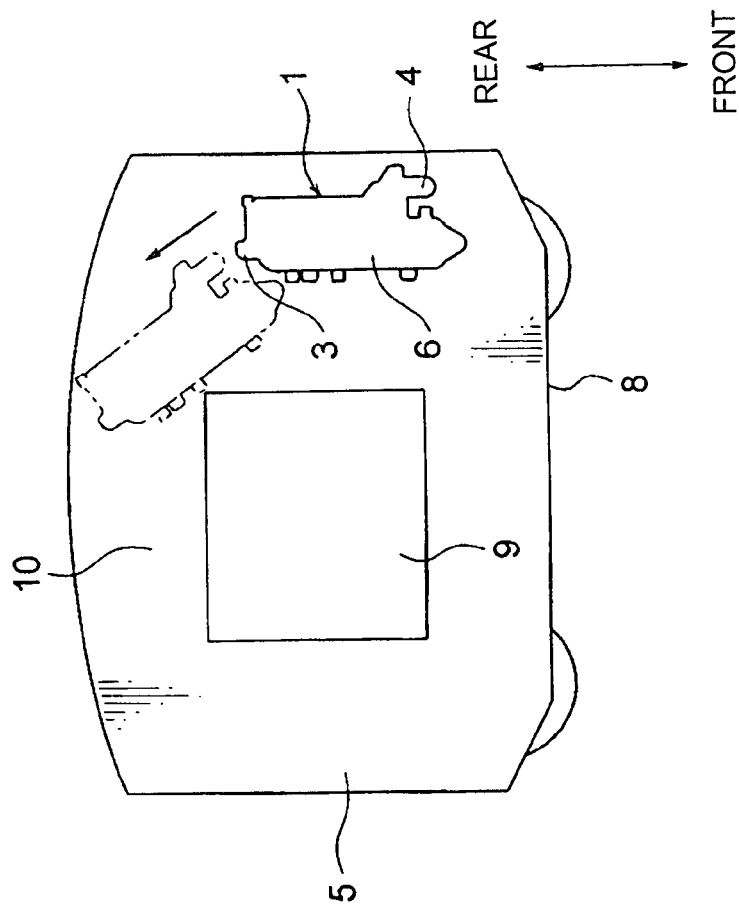
FIG. 5A is a view schematically illustrating a conventional electrical junction box, taken from the side of a portion where a component is secured
Figure 5B:
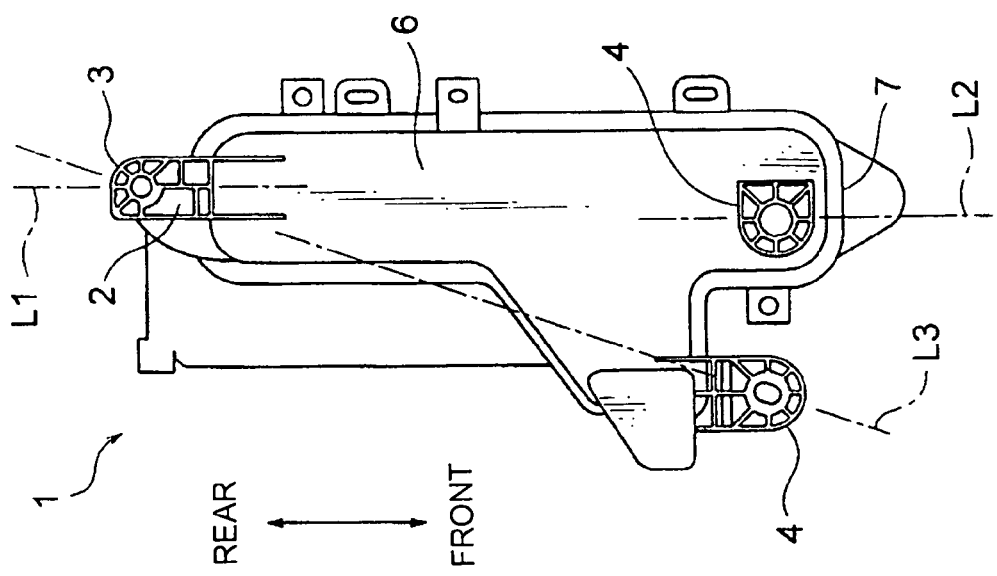
FIG. 5B is a view schematically illustrating a conventional electrical junction box in a state where the conventional junction box is mounted in a vehicle.

The first mounting foot 28 has the same functionality as in the case of a mounting foot 4 of a conventional electrical junction box 1 (see FIG. 5). The connecting portion 35 ensures necessary and sufficient mechanical strength.

The second mounting foot 29 is a mounting foot provided at an intermediate portion in a length direction of the electrical junction box 26. Also, the second mounting foot 29 is configured to be fastened and fixed via a fastening bolt 41 (see FIG. 3) upstandingly provided on the component-fixation section 25 (see FIG. 1) and a not-shown nut. The second mounting foot 29 includes a main fixing portion 42 and a connecting portion 43 that connects the main fixing portion 42 to the outer edge of the lower case 31.

In FIGS. 2 and 3, the main fixing portion 42 includes (a) a flat wall 44 having a seat surface corresponding to the above-described not-shown nut (colored or shaded with dots in order to distinguish it from a later-described throughhole 49), (b) a circular insertion hole 45 that passes through the wall 44 such that the above-described fastening bolt 41 is inserted, (c) a ring-shaped rib 46 whose inner surface defines the insertion hole 45, (d) a plurality of radial ribs 47 that extend radially from an outer surface of the ring-shaped rib 46, (e) a peripheral rib 48 to which outer ends of the radial ribs 47 continue, and (f) the above-described breakage-inducing portion 32 configured to induce breakage by a force in the vehicle collision.

The insertion hole 45 is a throughhole whose diameter is larger than that of the fastening bolt 41 (which is larger than the diameter of the insertion hole 37 of the first mounting foot 28). The radial ribs 47 extend at desired angles. The radial ribs 47 connect the ring-shaped rib 46 to the peripheral rib 48 with some of the ribs continuing to the connecting portion 43. Each of the radial ribs 47 has a different length. It should be noted that the peripheral rib 48 constitutes part of an outer edge of the second mounting foot 29.

In FIG. 3, breakage-inducing portion 32 extends in a displacement direction P in which the box body 27 is displaced relative to the crushable zone 24 and accordingly to a body of the automobile 21 when the vehicle collision occurs (see FIGS. 1 and 2), and also arranged such that it resides on a displacement trajectory Q that the fastening bolt 41 describes, i.e., a trajectory along which the fastening bolt 41 is displaced relative to the box body 27 in the vehicle collision (orientation of the displacement trajectory Q is for the purpose of illustration and not of limitation). In addition, when the displacement direction P and the displacement trajectory Q are modified, the arrangement of the breakage-inducing portion 32 will also be modified to adapt to the modified direction and trajectory. In this embodiment, it is assumed that the displacement trajectory Q extends from the insertion hole 45 to a lateral side of the second mounting foot 29). The breakage-inducing portion 32 includes a throughhole 49 passing through the flat wall 44 and a notch 50 whose recessed space continues to the throughhole 49.

The throughhole 49 is provided between an outer surface 46b of the ring-shaped rib 46a on the displacement trajectory Q and the inner surface 48b of the peripheral rib 48a on the displacement trajectory Q. Also, throughhole 49 is provided between a pair of the radial ribs 47a, 47b with the displacement trajectory Q therebetween. A distance between the radial ribs 47a, 47b is defined such that the fastening bolt 41 can pass between them when a breakage is induced.

The notch 50 is a recessed portion (groove) having a V-shape in plan view and is provided at an outer surface 46b of the ring-shaped rib 46a. The notch 50 constitutes a groove parallel to an axis of the fastening bolt 41. The notch 50 extends linearly from an end of the outer surface 46b to the other end thereof. The notch 50, when a stress concentrates upon it, is provided to readily create a crack in the ring-shaped rib 46a. In addition, the notch 50 is not limited to the above-described shape insofar as the stress can be readily concentrated.

The ring-shaped rib 46a is more thick-walled than the ring-shaped rib 46c which is the other portion of the ring-shaped rib 46 so as to compensate for a slightly decreased strength due to existence of the throughhole 49 (though thick-walled, the notch 50 allows the second mounting foot 29 to be more readily brought into breakage than a similar portion of a conventional mounting element.

The connecting portion 43 ensures necessary and sufficient mechanical strength.

In FIG. 2, the third mounting foot 30 is a leftmost mounting foot in the figure, in other words, a mounting foot provided at a region farthest away from the safety zone 22 (see FIG. 1). Also, the third mounting foot 30 is a portion to be fastened and fixed via a fastening bolt 51 (see FIG. 4) and a nut (not shown) upstandingly provided on the component-fixation section 25 (see FIG. 1). The third mounting foot 30 includes a main fixing portion 52 and a connecting portion 53 configured to connect the main fixing portion 52 to an outer edge of the lower case 31.

In FIGS. 2 and 4, the main fixing portion 52 includes (a) a flat wall 54 having a seat surface corresponding to the above-described not-shown nut (colored or shaded with dots for convenience of illustration to distinguish it from a later-described throughhole 59), (b) an oval insertion hole 55 that passes through the wall 54 such that the above-described fastening bolt 51 is inserted into the hole 55, (c) an oval ring-shaped rib 56 whose inner surface defines the insertion hole 55, (d) a plurality of radial ribs 57 radially extending from an outer surface of the ring-shaped rib 56, (e) a peripheral rib 58 continuing to outer ends of the radial ribs 57, and (f) the above-described breakage-inducing portion 33a configured to induce breakage by a force in a vehicle collision.

The insertion hole 55 is a throughhole whose minor axis is larger than the diameter of the fastening bolt 51 (i.e., larger than the insertion hole 37 of the first mounting foot 28). The radial ribs 67 extend at desired angles. The radial ribs 57 connect the ring-shaped rib 56 to the peripheral rib 58 with some of the ribs continuing to the connecting portion 53. The radial ribs 57 each have a different length. The peripheral rib 58 constitutes part of an outer edge of the third mounting foot 30.

In FIG. 4, the breakage-inducing portion 33 extends in the direction P in which the box body 27 is displaced relative to the crushable zone 24 and accordingly to a body of the automobile 21 when the vehicle collision occurs (see FIGS. 1, 2), and resides on the displacement trajectory R that the fastening bolt 51 describes, i.e., a trajectory along which the fastening bolt 51 is displaced relative to the box body 27 in the vehicle collision (the orientation of the displacement trajectory R is for the purpose of illustration and not of limitation). In addition, when the displacement direction P and the orientation of the displacement trajectory R are modified, arrangement of the breakage-inducing portion 33 will also be modified to adapt to the change. In this embodiment, the displacement trajectory R extends from the insertion hole 55 to a top of the third mounting foot 30. The breakage-inducing portion 33 includes a throughhole 59 that passes through the wall 54 and a notch 60 whose recessed space continues to the throughhole 59.

The throughhole 59 is provided between the outer surface 56b of the ring-shaped rib 56a on the displacement trajectory R and the inner surface 58b of the peripheral rib 58a on the displacement trajectory R. Also, the throughhole 59 is provided between the pair of the radial ribs 57a, 57b with the displacement trajectory R therebetween. A distance between the radial ribs 57a, 57b is defined such that the fastening bolt 51 can pass therethrough when breakage is induced.

The notch 60 is a recessed portion (groove) having a V-shape in plan view and is provided on an outer surface 56b of the ring-shaped rib 56a. The notch 60 is a groove extending in parallel to the axis of the fastening bolt 51. The notch 60 linearly extends from an end of the outer surface 56b to the other end thereof. The notch 60, when a stress concentrates upon it, allows a crack to be readily generated at the ring-shaped rib 56a. In addition, dimensions of the notch 60 are not limited to the above-described shape insofar as the shape readily allows concentration of the stress.

The ring-shaped rib 56a is more thick-walled than the ring-shaped rib 56c which is the other portion of the ring-shaped rib 56 in order to compensate for a slightly decreased strength due to existence of the throughhole 59 (though thick-walled, the notch 60 facilitates to a considerable degree the breakage when compared with a conventional equivalent).

The connecting portion 53 is configured so that necessary and sufficient strength is ensured.

In addition, the fastening bolts 41 and 51 are operable to be relatively displaced with respect to the second mounting foot 29 and the third mounting foot 30, respectively, in the vehicle collision.

The fastening bolts 41 and 51 reside on a region of the displacement trajectories Q, R where the connecting portion 43 and 53 and the box body 27 do not exist.

The following describes behavior of the electrical junction box 26 with the above-described configuration and structure in a case of the vehicle collision. In addition, with regard to the vehicle collision, it is assumed that, as shown in FIG. 1, the vehicle collision occurs from a rear side of the automobile 21.

When the vehicle collision occurs from the rear side of the automobile 21, the rear-side crushable zone 24 (a back of the vehicle body) collapses frontward from a rear portion to a front portion and, as a result of this collapse, an energy at the time of the vehicle collision is absorbed. At this point, the second mounting foot 29 and the third mounting foot 30 of the electrical junction box 26 out of the mounting feet 28, 29, 30 shown in FIG. 2 are brought into breakage. This means that a fixed state of the electrical junction box 26 is exited with these two points, so that the box body 27 is escaped frontward. The electrical junction box 26, by virtue of the box body 27 escaped frontward, can ensure that the property of crushability of the vehicle is not degraded and further the damage to the box body 27 itself can be avoided.

In FIG. 3, the displacement trajectory Q that the fastening bolt 41 describes is indicated by an arrow. Breakage of the second mounting foot 29 is achieved by the following process. Specifically, the fastening bolt 41 abuts (collides with) the inner surface 46d of the ring-shaped rib 46a. The ring-shaped rib 46a is pressed by an excessively large force, so that stress concentrates on the notch 50. When the stress concentrates on the notch 50, a crack is created in the ring-shaped rib 46a. When the crack reaches the inner surface 46d of the ring-shaped rib 46a, the ring-shaped rib 46a is brought into breakage. When the ring-shaped rib 46a is brought into breakage, the fastening bolt 41 passes the broken ring-shaped rib 46a, comes into the throughhole 49, and abuts (collides with) the inner surface 48b of the peripheral rib 48a. The peripheral rib 48a is pressed by a force of the fastening bolt 41, as a result of which the peripheral rib 48a is brought into breakage. At this point, the second mounting foot 29 is taken out of the fixed state.

In FIG. 4, breakage of the third mounting foot 30 will be follow the following process, as an arrow indicates the displacement trajectory R that the fastening bolt 51 may describe. Specifically, the fastening bolt 51 abuts (collides with) the inner surface 56d of the ring-shaped rib 56a. As a result, the ring-shaped rib 56a is pressed by a strong force, so that a stress is concentrated upon the notch 60. When the stress is concentrated upon the notch 60, a crack is created in the ring-shaped rib 56a. When the crack reaches the inner surface 56d of the ring-shaped rib 56a, the ring-shaped rib 56a is brought into breakage. When the ring-shaped rib 56a is broken, the fastening bolt 51 passes through the broken ring-shaped rib 56a, comes into the throughhole 59, and abuts (collides with) the inner surface 58b of the peripheral rib 58a. The peripheral rib 58a is pressed by the force of the fastening bolt 51, thereby the peripheral rib 58a is brought into breakage. At this point, the third mounting foot 30 is taken out of the fixed state.

As has been described in the foregoing with reference to FIGS. 1 to 4, according to the present invention, the arrangement of the breakage-inducing portions 32, 33 is such that the breakage-inducing portions 32, 33 are arranged to be in the direction in which the box body 27 is displaced in the vehicle collision and to reside on the displacement trajectories Q, R that the fastening bolts 41, 51 describe, so that the force at the time of the vehicle collision can effectively act upon the breakage-inducing portion 32, 33. Also, since the breakage-inducing portions 32, 33 includes the throughholes 49, 50 and the notches 50, 60, respectively, breakage is more readily induced. Accordingly, an advantageous effect is that the breakage of the second mounting foot 29 and the third mounting foot 30 are more readily achieved. Also, according to the present invention, a further advantageous effect is that determination of the arrangement of the breakage-inducing portions 32, 33 allows the detachment direction of the box body 27 to be more readily controlled.

Having now fully described the device according to the preferred embodiment of the present invention, it is clear that the foregoing is illustrative of the present invention and is not to be construed as limiting the invention. Those skilled in this art will readily effectuate possible modifications and variations without materially departing from the spirit and scope of the present invention.

What is claimed is:

1. An electrical junction box fixed to a component-fixation section in a vehicle, comprising at least one mounting foot, the mounting foot including:
    an insertion hole into which a fastening bolt upstanding on the component-fixation section is inserted;
    a ring-shaped rib whose inner surface defines the insertion hole;
    a plurality of radial ribs radially extending from an outer surface of the ring-shaped rib; and
    a breakage-inducing portion comprising a throughhole defined by a part of an outer surface of the ring-shaped rib, an outer edge of the mounting foot, and a pair of the plurality of radial ribs between which a displacement trajectory extends, configured to induce a breakage of the mounting foot in a vehicle collision, the breakage-inducing portion extending in the displacement direction in which a box body of the electrical junction box is displaced in the vehicle collision, and residing on a displacement trajectory in which the fastening bolt is displaced in the vehicle collision.

2. The electrical junction box as set forth in claim 1, wherein the breakage-inducing portion provided on the displacement trajectory includes
    a notch provided on the outer surface of the ring-shaped rib, a recessed space of the notch continuing to the throughhole.

3. An electrical junction box fixed to a component-fixation section in a vehicle, comprising at least one mounting foot, the mounting foot including:
    an insertion hole into which a fastening bolt upstanding on the component-fixation section is inserted;
    a ring-shaped rib whose inner surface defines the insertion hole;
    a plurality of radial ribs radially extending from an outer surface of the ring-shaped rib; and
    a breakage-inducing portion comprising a throughhole between two of the plurality of the radial ribs and a notch on a part of a surface of the ring-shaped rib defining the throughhole, configured to induce a breakage of the mounting foot in a vehicle collision, the breakage-inducing portion extending in a displacement direction in which a box body of the electrical junction box is displaced in the vehicle collision, and residing on a displacement trajectory in which the fastening bolt is displaced in the vehicle collision.

* * * * *